(12) United States Patent
Hwang

(10) Patent No.: US 12,477,721 B2
(45) Date of Patent: Nov. 18, 2025

(54) SEMICONDUCTOR DEVICE WITH LOW K SPACER AND METHOD FOR FABRICATING THE SAME

(71) Applicant: SK hynix Inc., Gyeonggi-do (KR)

(72) Inventor: Se Ra Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 213 days.

(21) Appl. No.: 17/685,682

(22) Filed: Mar. 3, 2022

(65) Prior Publication Data

US 2023/0037646 A1   Feb. 9, 2023

(30) Foreign Application Priority Data

Aug. 9, 2021   (KR) .................... 10-2021-0104782

(51) Int. Cl.
H10B 12/00 (2023.01)
(52) U.S. Cl.
CPC ........... *H10B 12/315* (2023.02); *H10B 12/09* (2023.02); *H10B 12/34* (2023.02); *H10B 12/50* (2023.02)
(58) Field of Classification Search
CPC ...... H10B 12/315; H10B 12/09; H10B 12/34; H10B 12/50; H10B 12/0335; H10B 12/48; H10B 12/482; H01L 21/76897
USPC ....................................................... 257/278
See application file for complete search history.

(56) References Cited

U.S. PATENT DOCUMENTS

| 7,763,542 | B2* | 7/2010 | Kim ................. H01L 21/3185 257/547 |
| 9,722,096 | B2* | 8/2017 | Kawashima ...... H01L 21/28176 |
| 10,490,557 | B2 | 11/2019 | Feng et al. |
| 10,665,498 | B2* | 5/2020 | Kim .................... H10B 12/482 |
| 10,672,773 | B2* | 6/2020 | Ji ........................ H10B 12/485 |
| 10,847,579 | B1* | 11/2020 | Nazarian ............. G11C 13/003 |
| 11,152,368 | B2* | 10/2021 | Choi ................... H10B 12/033 |
| 11,823,904 | B2* | 11/2023 | Cho ..................... H01L 21/0332 |
| 2003/0057561 | A1* | 3/2003 | Fukuyama ........ H01L 21/76832 257/774 |
| 2011/0121403 | A1* | 5/2011 | Lee .......................... H10B 41/27 257/E27.06 |
| 2016/0379986 | A1* | 12/2016 | Chang .................... H10D 87/00 257/301 |

(Continued)

FOREIGN PATENT DOCUMENTS

| CN | 111653567 A * | 9/2020 | ....... H01L 27/10805 |
| KR | 10-2015-0118485 A | 10/2015 | |
| KR | 10-2019-0112443 A | 10/2019 | |

(Continued)

OTHER PUBLICATIONS

Office Action for Korean Patent Application No. 10-2021-0104782 issued by the Korean Patent Office on Apr. 25, 2025.

*Primary Examiner* — Ori Nadav
(74) *Attorney, Agent, or Firm* — IP & T GROUP LLP

(57) ABSTRACT

A semiconductor device includes a bit line structure and a storage contact spaced apart from each other over a substrate; a bit line spacer formed on a sidewall of the bit line structure; a landing pad formed over the storage contact; a boron-containing capping layer disposed between the bit line structure and the landing pad; a boron-containing etch stop layer over the boron-containing capping layer; and a capacitor including a storage node coupled to the landing pad by passing through the boron-containing etch stop layer.

12 Claims, 18 Drawing Sheets

(56) References Cited

U.S. PATENT DOCUMENTS

2020/0152634 A1* 5/2020 Lee .................. H01L 21/311
2022/0093387 A1* 3/2022 Lee .................. H01L 21/02274

FOREIGN PATENT DOCUMENTS

KR  10-2020-0053809 A  5/2020
KR  10-2021-0024506 A  3/2021

* cited by examiner

SEMICONDUCTOR DEVICE WITH LOW K SPACER AND METHOD FOR FABRICATING THE SAME

CROSS-REFERENCE TO RELATED APPLICATIONS

The present application claims priority to Korean Patent Application No. 10-2021-0104782, filed on Aug. 9, 2021, which is incorporated herein by reference in its entirety.

BACKGROUND

1. Field

Present invention relates to a semiconductor device and, more particularly, to a semiconductor device including a low-k spacer and a method for fabricating the same.

2. Description of the Related Art

In a semiconductor device, a dielectric material is formed between neighboring pattern structures. As semiconductor devices are being highly integrated, a gap between pattern structures is decreasing. Accordingly, parasitic capacitance is increasing. As the parasitic capacitance increases, performance of semiconductor devices deteriorates.

SUMMARY

Various embodiments of the present invention provide a semiconductor device that can reduce parasitic capacitance between neighboring pattern structures and a method for fabricating the semiconductor device.

A semiconductor device according to an embodiment of the present invention comprises: a bit line structure and a storage contact spaced apart from each other over a substrate; a bit line spacer formed on a sidewall of the bit line structure; a landing pad formed over the storage contact; a boron-containing capping layer disposed between the bit line structure and the landing pad; a boron-containing etch stop layer over the boron-containing capping layer; and a capacitor including a storage node coupled to the landing pad by passing through the boron-containing etch stop layer.

A semiconductor device according to an embodiment of the present invention comprises: a substrate including a cell region and a peripheral circuit region; a plurality of storage contacts disposed over the substrate of the cell region; landing pads formed over the storage contacts, respectively; metal interconnections disposed over the substrate of the peripheral circuit region; a boron-containing capping layer disposed between the landing pads; a boron-containing spacer layer disposed between the metal interconnections; and a carbon-containing spacer layer over the boron-containing spacer layer.

A method for fabricating a semiconductor device according to an embodiment of the present invention comprises: forming a plurality of storage contacts in an upper portion of a substrate of a cell region, the substrate including the cell region and a peripheral circuit region; forming landing pads over the storage contacts, respectively; forming metal interconnections over the substrate of the peripheral circuit region; forming a boron-containing capping layer between the landing pads; forming a boron-containing spacer layer between the metal interconnections; and forming a carbon-containing spacer layer over the boron-containing spacer layer.

The present invention may improve hydrogen passivation properties in a cell region without deteriorating the negative bias temperature instability of a peripheral circuit region by selectively combining a boron-containing material and a carbon-containing material.

DETAILED DESCRIPTION

Figure 1:
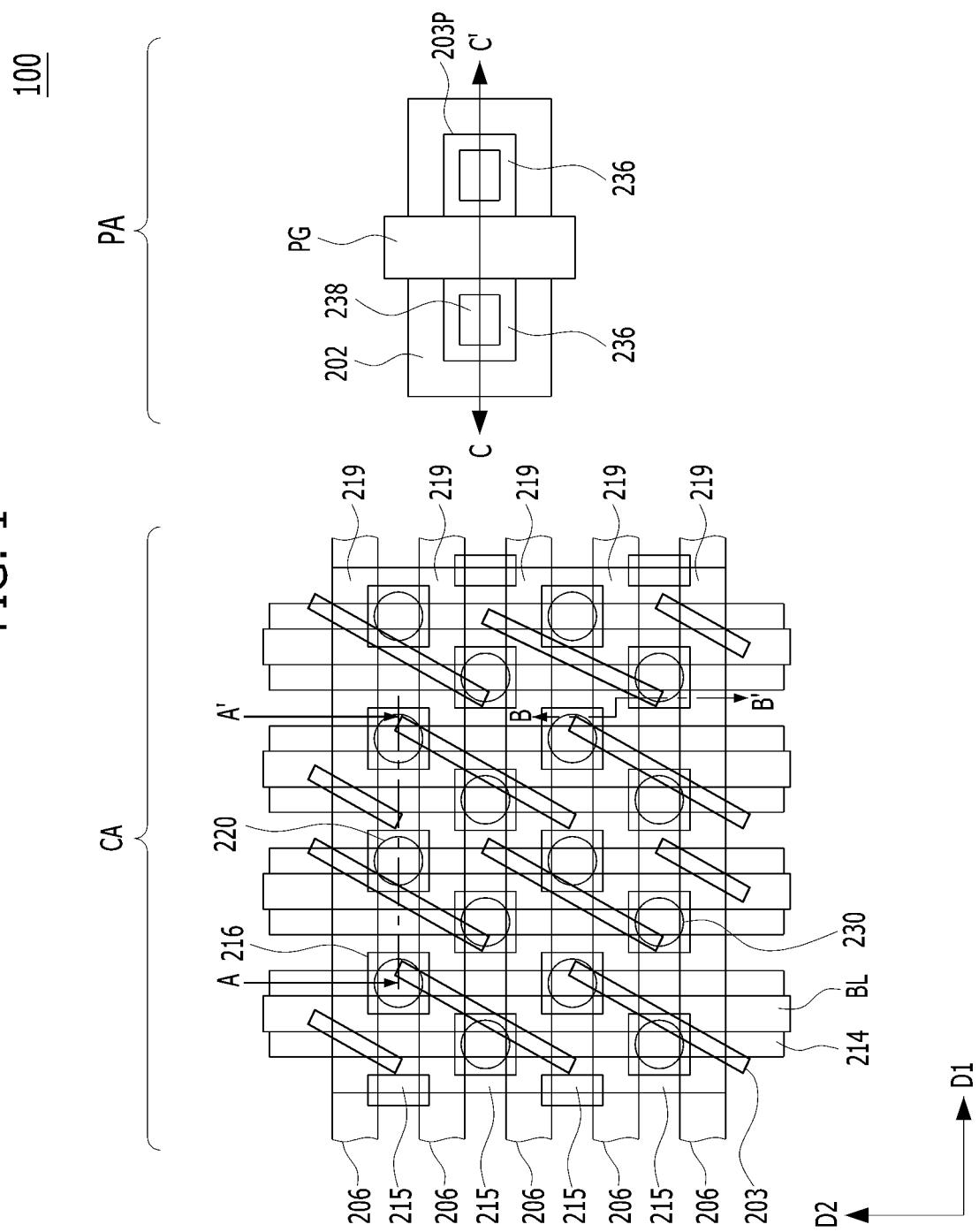
FIG. 1 is a plan view illustrating a semiconductor device according to an embodiment of the present invention.

Various embodiments described herein will be described with reference to cross-sectional views, plan views and block diagrams, which are schematic views of the present invention. Therefore, the structures of the drawings may be modified by fabricating technology and/or tolerances. Various embodiments of the present invention are not limited to the specific structures shown in the drawings but include any changes in the structures that may be produced according to the fabricating process. Also, any regions and shapes of regions illustrated in the drawings have schematic views, are intended to illustrate specific examples of structures of regions of the various elements and are not intended to limit the scope of the invention.

Figure 2A:
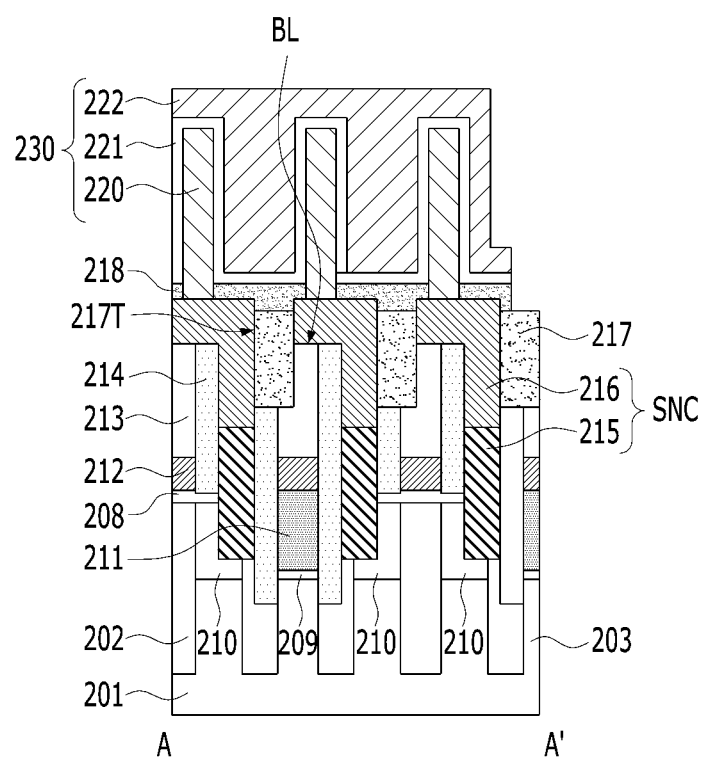
FIG. 2A is a cross-sectional view taken along a line A-A' of FIG. 1.
Figure 2B:
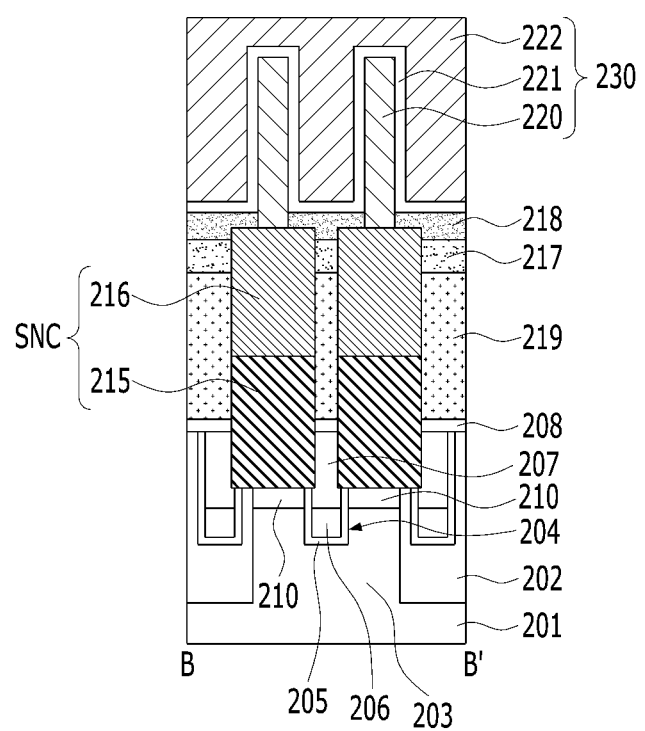
FIG. 2B is a cross-sectional view taken along a line B-B' of FIG. 1.
Figure 2C:
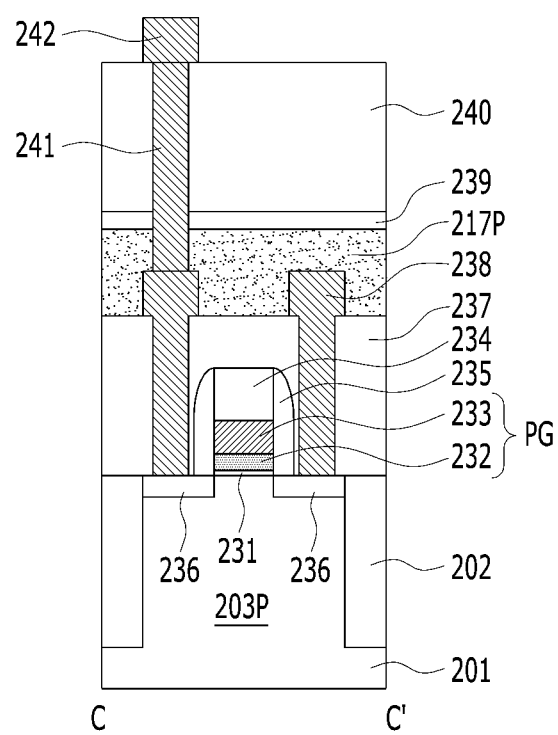
FIG. 2C is a cross-sectional view taken along a line C-C' of FIG. 1.

FIG. 1 is a plan view illustrating a semiconductor device according to an embodiment of the present invention. FIG. 2A is a cross-sectional view taken along a line A-A' of FIG. 1. FIG. 2B is a cross-sectional view taken along a line B-B' of FIG. 1. FIG. 2C is a cross-sectional view taken along a line C-C' of FIG. 1.

Referring to FIGS. 1 to 2C, a semiconductor device 100 may include a cell region CA and a peripheral circuit region PA. The cell region CA may include a plurality of memory cells. Each memory cell may include a cell transistor including a buried word line 206, a bit line 212, and a capacitor 230.

A semiconductor device 100 will be described in detail below.

A device isolation layer 202 and an active region 203 may be formed in a substrate 201. A plurality of active regions 203 may be defined by the device isolation layer 202. The substrate 201 may be a material suitable for semiconductor processing. The substrate 201 may include a semiconductor substrate. The substrate 201 may be formed of a silicon-containing material. For example, the substrate 201 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 201 may include other semiconductor materials such as germanium. The substrate 201 may include a III/V group semiconductor substrate, for example, a chemical compound semiconductor substrate such as GaAs.

The substrate 201 may include a silicon on insulator (SOI) substrate. The device isolation layer 202 may be formed by a shallow trench isolation (STI) process.

A gate trench 204 may be formed in the substrate 201. A gate dielectric layer 205 may be formed on a bottom surface and sidewall surface of the gate trench 204. A buried word line 206 partially filling the gate trench 204 may be formed on the gate dielectric layer 205. A gate capping layer 207 may be formed on the buried word line 206. An upper surface of the buried word line 206 may be at a lower level than an upper surface of the substrate 201. The buried word line 206 may be made of a low-resistivity metal material. In an embodiment, the buried word line 206 may be formed of a stack of sequentially stacked titanium nitride (TiN) and tungsten (W). In another embodiment, the buried word line 206 may be formed of TiN only. The buried word line 206 may be referred to as 'buried gate electrode'. The buried word line 206 may extend in a first direction D1.

A first impurity region 209 and a second impurity region 210 may be formed in the substrate 201. The first and second impurity regions 209 and 210 may be spaced apart from each other by the gate trench 205. The first and second impurity regions 209 and 210 may be referred to as source/drain regions. The first and second impurity regions 209 and 210 may include N-type impurities such as arsenic (As) or phosphorus (P). Therefore, the buried word line 206 and the first and second impurity regions 209 and 210 may be cell transistors. The cell transistors may improve the short channel effect by the buried word line 206.

A bit line contact plug 211 may be formed on the substrate 201. The bit line contact plug 211 may be connected to the first impurity region 209. The bit line contact plug 211 may be disposed in a bit line contact hole (reference numeral is omitted). The bit line contact hole may extend in the substrate 201 by penetrating through a hard mask layer 208. The hard mask layer 208 may be formed on the substrate 201. The hard mask layer 208 may include a dielectric material. A lower surface of the bit line contact plug 211 may be at a lower level than upper surfaces of the device isolation layer 202 and the active region 203. The bit line contact plug 211 may be formed, for example, of polysilicon or a metal material. A portion of the bit line contact plug 211 may have a smaller line width than a diameter of the bit line contact hole. A bit line 212 may be formed on the bit line contact plug 211. A bit line hard mask 213 may be formed on the bit line 212. A stack structure of the bit line contact plug 211, the bit line 212, and the bit line hard mask 213 may be referred to as a 'bit line structure BL'. The bit line 212 may have a line shape extending in a second direction D2 crossing the buried word line 206. A portion of the bit line 212 may be connected to the bit line contact plug 211. Referring to FIG. 2A, the bit line 212 and the bit line contact plug 211 may have the same line width. Therefore, the bit line 212 may cover the bit line contact plug 211 and extend in the second direction D2. The bit line 212 may include, for example, a metal material such as tungsten. The bit line hard mask 213 may include, for example, a dielectric material such as silicon nitride.

A bit line spacer 214 may be formed on sidewalls of the bit line contact plug 211 and the bit line 212. The bit line spacer 214 may be extended to be formed on a sidewall of the bit line hard mask 213. The bit line spacer 214 may include, for example, silicon oxide, silicon nitride, boron nitride, SiCO, SiCN, SiOCN, SiBN, SiBCN or a combination of thereof.

A storage node contact plug SNC may be formed between neighboring bit line structures BL. The storage node contact plug SNC may be connected to the second impurity region 210. The storage node contact plug SNC may include a storage contact 215 and a landing pad 216. The storage node contact plug SNC may further include an ohmic contact layer (reference numeral omitted) between the storage contact 215 and the landing pad 216. The ohmic contact layer may include, for example, a metal silicide. For example, the storage contact 215 may include polysilicon, and the landing pad 216 may include metal nitride, a metal material, or a combination thereof.

Referring to FIG. 2B, a plug isolation layer 219 may be formed between neighboring storage node contact plugs SNC. The neighboring storage node contact plugs SNC may be spaced apart from each other by the plug isolation layer 219. Between the neighboring bit line structures BL, a plurality of plug isolation layers 219 and a plurality of storage node contact plugs SNC may be alternately disposed.

A low-k capping layer 217 may be formed between the landing pads 216. A pad isolation trench 217T may be formed between the landing pads 216 and the bit line structures BL, and the low-k capping layer 217 may be formed in the pad isolation trenches 217T.

An etch stop layer 218 may be formed on the low-k capping layer 217 and the landing pads 216.

A capacitor 230 may be formed on the landing pad 216. The capacitor 230 may include a storage node 220, a dielectric layer 221, and a plate node 222. The storage node 220 may be of a pillar type (having a pillar shape) and may be connected to the landing pad 216.

In an embodiment, the storage node 220 may be a cylinder type (having a cylinder shape) other than the pillar type.

At least a peripheral transistor may be formed in the peripheral circuit region PA. A peripheral active region 203P and a device isolation layer 202 may be formed in the substrate 201. A peripheral gate structure may be formed on the peripheral active region 203P. The peripheral gate structure may include a stack of a peripheral gate dielectric layer 231, a peripheral gate electrode PG, and a gate hard mask 234. The peripheral gate electrode PG may include a stack of a polysilicon electrode 232 and a metal electrode 233. A gate spacer 235 may be formed on a sidewall of the peripheral gate structure. Source/drain regions 236 may be formed in the peripheral active region 203P below the peripheral gate structure. Metal interconnections 238 may be connected to the source/drain regions 236. The metal interconnections 238 may be connected to corresponding source/drain regions 236 by penetrating through the interlayer dielectric layer 237.

A first low-k spacer layer 217P may be formed between the metal interconnections 238, and a second low-k spacer layer 239 may be formed on the first low-k spacer layer 217P.

An intermetallic dielectric layer 240 may be formed on the second low-k spacer layer 239, and a via 241 penetrating through the intermetallic dielectric layer 240 may be formed. The via 241 may be connected to the metal interconnections 238 by penetrating through the low-k spacer layer 239 and the first low-k spacer layer 217P. Upper-level metal interconnections 242 may be formed on the via 241.

The metal interconnections 238 and the landing pads 216 may be disposed at the same level.

According to FIGS. 1 and 2C, the low-k capping layer 217 and the first low-k spacer layer 217P may be the same material. The low-k capping layer 217 and the first low-k spacer layer 217P may include a low-k material. The low-k capping layer 217 and the first low-k spacer layer 217P may include a boron-containing low-k material. The low-k capping layer 217 and the first low-k spacer layer 217P may include a boron nitride-based material. For example, the low-k capping layer 217 and the first low-k spacer layer 217P may include boron nitride (BN), SiBN, or SiBCN. The low-k capping layer 217 may improve hydrogen passivation properties in the cell region CA. The first low-k spacer layer 217P may improve the hydrogen passivation properties in the peripheral circuit region PA. The low-k capping layer 217 and the first low-k spacer layer 217P may be a carbon-free material, and the second low-k spacer layer 239 may be a carbon-containing material. For example, the low-k capping layer 217 and the first low-k spacer layer 217P may be SiBN, the second low-k spacer layer 239 may be SiCN, and the etch stop layer 218 may be silicon nitride ($Si_3N_4$). The low-k capping layer 217 and the first low-k spacer layer 217P may include a boron nitride-based material. For example, the low-k capping layer 217 and the first low-k spacer layer 217P may include boron nitride (BN), SiBN, or SiBCN. The low-k capping layer 217 may improve hydrogen passivation properties in the cell region CA. The first low-k spacer layer 217P may improve hydrogen passivation properties in the peripheral circuit region PA. The low-k capping layer 217 and the first low-k spacer layer 217P may be a carbon-free material, and the second low-k spacer layer 239 may be a carbon-containing material. For example, the low-k capping layer 217 and the first low-k spacer layer 217P may be made of SiBN, the second low-k spacer layer 239 may be made of SiCN, and the etch stop layer 218 may be formed of silicon nitride ($Si_3N_4$).

In another embodiment, the low-k capping layer 217 and the first low-k spacer layer 217P may include 1:1 SiBN in which a ratio of silicon nitride (SiN) to boron nitride (BN) is 1:1. The 1:1 SiBN may have a boron concentration of about 17 to 18 at %.

In another embodiment, the low-k capping layer 217 and the first low-k spacer layer 217P may include 1:2 SiBN in which a ratio of silicon nitride (SiN) to boron nitride (BN) is 1:2. The 1:2 SiBN may have a boron concentration of about 20 to 21 at %.

In another embodiment, the low-k capping layer 217 and the first low-k spacer layer 217P may include 2:3 SiBN having a ratio of silicon nitride (SiN) to boron nitride (BN) of 2:3. The 2:3 SiBN may have a boron concentration of about 18 to 19 at %.

The second low-k spacer layer 239 may include a material that improves negative bias temperature instability (NBTI) in the peripheral circuit region PA. The NBTI refers to the trapping of positive charges such as hydrogen at an interface between the gate dielectric layer and the substrate during operation of the transistor, thereby deteriorating transistor characteristics. In order to improve NBTI, the second low-k spacer layer 239 may include a hydrogen trapping material, for example, a material containing carbon capable of trapping hydrogen. The second low-k spacer layer 239 may include a low-k material containing carbon, for example, SiCO, SiCN, SiOCN, or SiOCN. The first low-k spacer layer 217P and the second low-k spacer layer 239 may be made of different materials. The second low-k spacer layer 239 may be made of a material harder than the first low-k spacer layer 217P. For example, the first low-k spacer layer 217P may be made of SiBN, and the second low-k spacer layer 239 may be made of SiCN. SiBN may improve the passivation properties in the cell region CA, and SiCN may improve the NBTI in the peripheral circuit region PA. The second low-k spacer layer 239 may be formed in the peripheral circuit region PA and not in the cell region CA.

The etch stop layer 218 may include silicon nitride. The etch stop layer 218 may be formed in the cell region CA, but may not be formed in the peripheral circuit region PA. The etch stop layer 218 may be removed during an etching process for forming the plate node 222.

In another embodiment, the etch stop layer 218 may include a boron-containing material. The etch stop layer 218 may include a boron nitride-based material. For example, the etch stop layer 218 may include 2:1 SiBN in which a ratio of silicon nitride (SiN) to boron nitride (BN) is 2:1. The 2:1 SiBN may have a lower boron concentration than the 1:1 SiBN.

The low-k capping layer 217 and the first low-k spacer layer 217P may include a first boron nitride-based material, and the etch stop layer 218 may include a second boron nitride-based material, wherein the first boron nitride-based material may have a greater boron concentration than the second boron nitride-based material. The low-k capping layer 217 may include a first SiBN, the etch stop layer 218 may include a second SiBN, and the first SiBN has a greater boron concentration than the second SiBN. For example, when the low-k capping layer 217 and the first low-k spacer layer 217P include the 1:2 SiBN in which a ratio of silicon nitride (SiN) to boron nitride (BN) is 1:2, the etch stop layer 218 may include the 2:1 SiBN in which a ratio of silicon nitride (SiN) to boron nitride (BN) is 2:1.

Both the low-k capping layer 217 and the bit line spacer 214 may include SiBN, wherein the SiBN of the low-k capping layer 217 may have a greater boron concentration than the SiBN of the bit line spacer 214.

The bit line spacer 214, the low-k capping layer 217, and the etch stop layer 218 each include SiBN, and the SiBN of the low-k capping layer 217 may have a greater boron concentration than the SiBN of the bit line spacer 214 and the SiBN of the etch stop layer 218.

Parasitic capacitance between neighboring landing pads 216 may be reduced by the low-k capping layer 217. Parasitic capacitance between the adjacent metal interconnections 238 may be reduced by the first low-k spacer layer 217P.

Since the second low-k spacer layer 239 is a hard material, it is possible to easily control the profile of the via 241. When the second low-k spacer layer 239 is omitted, the profile of the via 241 may be poor due to the softness of the first low-k spacer layer 217P. For example, the critical dimension of the bottom surface of the via hole may be easily secured by the second low-k spacer layer 239 during an etching process for forming a via hole to be filled with the via 241.

FIGS. 3 to 14 are diagrams illustrating a method for fabricating the semiconductor device 100 according to an embodiment of the present invention. FIGS. 3 to 14 are cross-sectional views taken along lines A-A' and C-C' of FIG. 1. Cross-sectional views taken along the line A-A' of FIG. 1 illustrate a fabricating method for the cell region CA. Cross-sectional views taken along the line C-C' of FIG. 1 illustrate a fabricating method for the peripheral circuit region PA.

Figure 3:
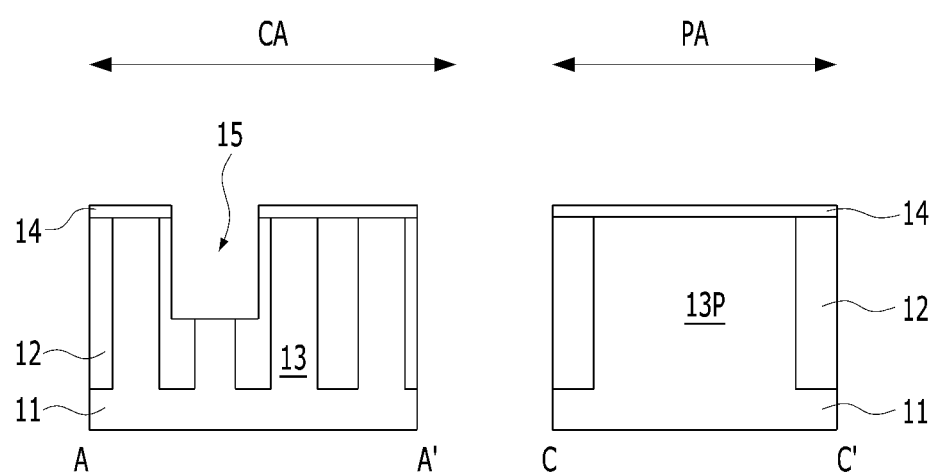
FIGS. 3 to 14 are diagrams illustrating a method for fabricating a semiconductor device 100 according to an embodiment of the present invention.

As shown in FIG. 3, a device isolation layer 12 may be formed in the substrate 11 including the cell region CA and the peripheral circuit region PA. A plurality of active regions 13 are defined by the device isolation layer 12. The device isolation layer 12 may be formed by a Shallow Trench Isolation (STI) process. The STI process may include etching the substrate 11 to form an isolation trench (reference numeral omitted) and then, filling the isolation trench with a dielectric material to form the device isolation layer 12.

The device isolation layer 12 may include, for example, silicon oxide, silicon nitride, or a combination thereof. Any suitable process may be used to fill the isolation trench with a dielectric material, including for example, a chemical vapor deposition (CVD) or some other deposition process. A planarization process such as chemical-mechanical polishing (CMP) may additionally be used. A peripheral active area 13P may be defined in the substrate 11 of the peripheral circuit region PA.

A hard mask layer 14 may be formed on the substrate 11. The hard mask layer 14 may cover the top surface of the isolation layer 12, the top surface of the active region 13, and the top surface of the peripheral active region 13P.

Subsequently, although not shown, a buried word line structure may be formed in the cell region CA of the substrate 11. The buried word line structure will be referred to with reference to FIG. 2B. Referring to FIG. 2B again, the buried word line structure may include a gate trench 204, a gate dielectric layer 205 covering the bottom surface and sidewalls of the gate trench 204, a buried word line 206 partially filling the gate trench 204 on the gate dielectric layer 205, and a gate capping layer 207 formed on the buried word line 206. To form the gate trench 204, a hard mask layer 14 may be used as an etch barrier. The hard mask layer 14 may have a shape patterned by a mask pattern. The hard mask layer 14 may include, for example, silicon oxide. In an embodiment, the hard mask layer 14 may include tetra ethyl ortho silicate (TEOS).

Next, a bit line contact hole 15 may be formed in the cell region CA. The hard mask layer 14 may be etched using a contact mask (not shown) to form the bit line contact hole 15. The bit line contact hole 15 may have a circle shape or an elliptical shape when viewed in a plan view. A portion of the substrate 11 may be exposed through the bit line contact hole 15. The bit line contact hole 15 may have a controlled diameter with a predetermined line width. The bit line contact hole 15 may have a shape exposing a portion of the active region 13. In an etching process for forming the bit line contact hole 15, the device isolation layer 12 and a portion of the active region 13 may be etched. Accordingly, the bottom of the bit line contact hole 15 may be extended into the substrate 11.

Figure 4:
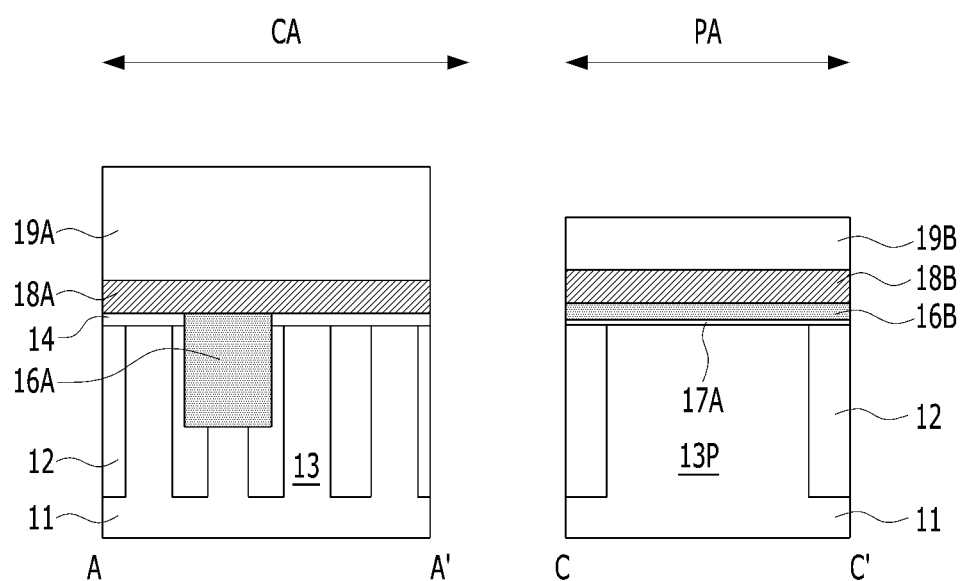

As shown in FIG. 4, a pre-plug 16A is formed. The pre-plug 16A may be formed by selective epitaxial growth (SEG). For example, the pre-plug 16A may include an epitaxial layer doped with phosphorus, for example, SEG SiP. In this way, the pre-plug 16A may be formed without voids by selective epitaxial growth. In another embodiment, the pre-plug 16A may be formed by depositing a polysilicon layer and performing a CMP process on the polysilicon layer. The pre-plug 16A may fill the bit line contact hole 15. The upper surface of the pre-plug 16A may be at the same level as the upper surface of the hard mask layer 14.

Next, a bit line conductive layer 18A and a bit line hard mask layer 19A may be stacked in the cell region CA. The bit line conductive layer 18A and the bit line hard mask layer 19A may be sequentially stacked on the pre-plug 16A and the hard mask layer 14 in the recited order. The bit line conductive layer 18A may include a metal-containing material. The bit line conductive layer 18A may include, for example, a metal, a metal nitride, a metal silicide, or a combination thereof. In an embodiment, the bit line conductive layer 18A may include tungsten (W). In another embodiment, the bit line conductive layer 18A may include a stack of titanium nitride and tungsten (TiN/W). When the bit line conductive layer 18A includes a stack of titanium nitride and tungsten (TiN/W), the titanium nitride may serve as a barrier. The bit line hard mask layer 19A may be formed of a dielectric material having an etch selectivity with respect to the bit line conductive layer 18A and the pre-plug 16A. The bit line hard mask layer 19A may include, for example, silicon oxide or silicon nitride. In an embodiment, the bit line hard mask layer 19A may be formed of silicon nitride.

A peripheral gate dielectric layer 17A, a polysilicon layer 16B, a metal layer 18B, and a gate hard mask layer 19B may be formed on the substrate 11 in the peripheral circuit region PA in the recited order. The peripheral gate dielectric layer 17A may be formed on the top surface of the peripheral active area 13P and the top surface of the isolation layer 12 in the peripheral circuit region PA.

Figure 5:
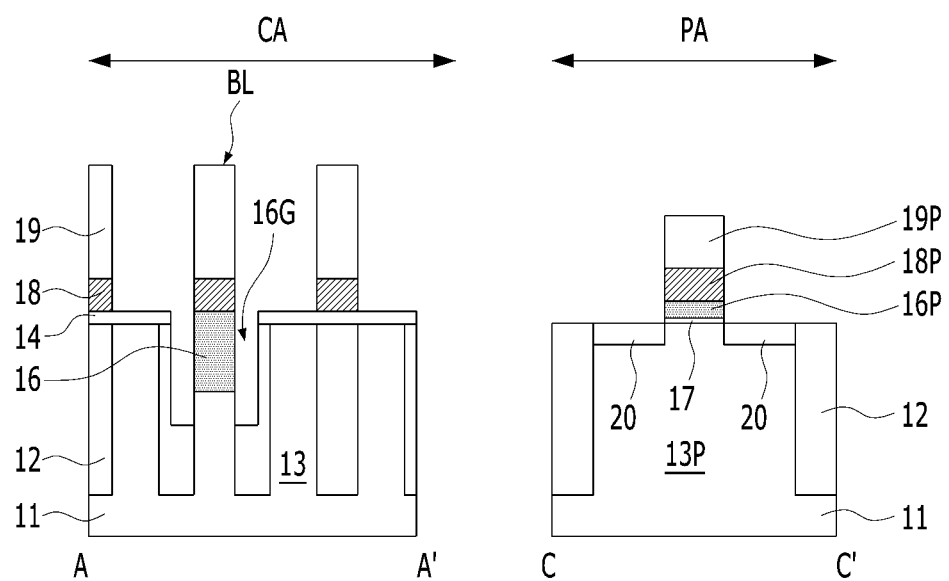

As shown in FIG. 5, a bit line 18 and a bit line contact plug 16 may be formed. The bit line 18 and the bit line contact plug 16 may be formed by an etching process using a bit line mask layer (not shown).

For example, the bit line hard mask layer 19A and the bit line conductive layer 18A may be etched using the bit line mask layer as an etch barrier. Accordingly, the bit line 18 and the bit line hard mask 19 may be formed. The bit line 18 may be formed by etching the bit line conductive layer 18A. The bit line hard mask 19 may be formed by etching the bit line hard mask layer 19A.

Subsequently, the pre-plug 16A may be etched to form the bit line contact plug 16 having a line width which is the same to the line width of the bit line 18. The bit line contact plug 16 may be formed in the bit line contact hole 15. The line width of the bit line contact plug 16 is smaller than the diameter of the bit line contact hole 15. Accordingly, a gap 16G may be defined at both sides of the bit line contact plug 16.

As described above, gaps 16G are formed in the bit line contact hole 15 as the bit line contact plug 16 is formed. This is because the line width of the bit line contact plug 16 is formed to be smaller than the diameter of the bit line contact hole 15. The gap 16G is not formed to have a shape surrounding the bit line contact plug 16, but rather the gap 16G is formed independently on both sidewalls of the bit line contact plug 16. As a result, one bit line contact plug 16 and a pair of gaps 16G are disposed in the bit line contact hole 15. The gaps 16G in the pair of gaps are spaced apart from each other by the bit line contact plug 16. A bottom surface of each of the gaps 16G may extend into the device isolation layer 12. The bottom surface of each of the gaps 16G may be at a lower level than the bottom surface of the bit line contact plug 16.

A structure in which the bit line contact plug 16, the bit line 18, and the bit line hard mask 19 are stacked in the recited order may be referred to as a 'bit line structure (BL)'. From the top view, the bit line structure BL may be a line-shaped pattern structure extending in any one direction.

A peripheral gate structure may be formed on the substrate 11 in the peripheral circuit region PA. The peripheral gate structure may include a peripheral gate dielectric layer 17, a polysilicon electrode 16P, a metal electrode 18P, and a gate hard mask 19P stacked on each other in the recited order.

After forming the peripheral gate structure, source/drain regions 20 may be formed in the substrate 11 of the peripheral circuit region PA on either side of the peripheral gate structure.

Figure 6:
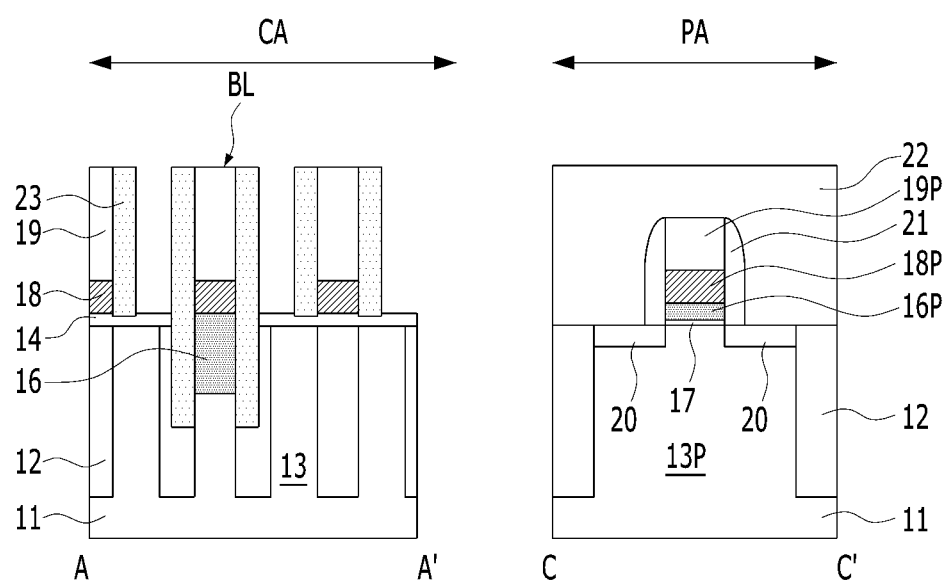

As shown in FIG. 6, a bit line spacer 23 may be formed on the sidewall of the bit line structure BL. A portion of the bit line spacer 23 may fill the gap 16G. The bit line spacer 23 may include, for example, silicon oxide, silicon nitride, a low-k material, or a combination thereof. The low-k material may include SiCO, SiCN, SiOCN, SiBN, SiBCN or a combination thereof. In another embodiment, the bit line spacer 23 may include a combination of an air gap and a low-k material. The bit line spacer 23 may include NKOK, NKN, NKON, KON, KOK or NKAK (Nitride-Low k-Air gap-Low k), where 'K' refers to a low-k material, 'N' refers to silicon nitride, and 'O' refers to silicon oxide. The bit line spacer 23 may include an air gap between dielectric spacers.

A gate spacer 21 may be formed on both sidewalls of the peripheral gate structure. The gate spacer 21 may include, for example, silicon oxide, silicon nitride, a low-k material, or a combination thereof. The low-k material may include SiCO, SiCN, SiOCN, SiBN or SiBCN. In another embodiment, the gate spacer 21 may include an air gap.

The bit line spacer 23 and the gate spacer 21 may be formed of the same material.

After the gate spacer 21 is formed, the interlayer dielectric layer 22 may be formed. The interlayer dielectric layer 22 may be formed in the peripheral circuit region PA.

Figure 7:
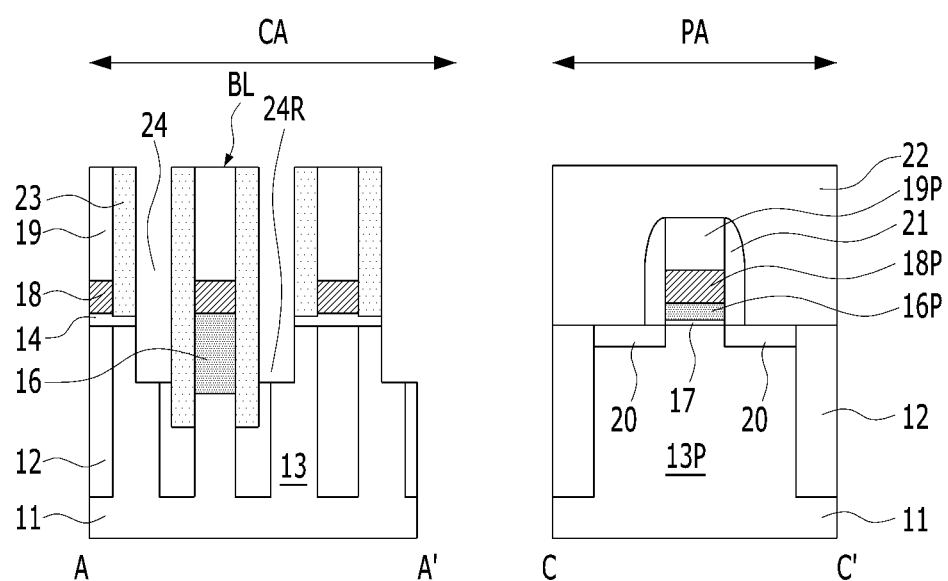

As shown in FIG. 7, a plurality of contact openings 24 may be formed between the bit line structures BL. The underlying materials may be etched to self-align with the contact openings 24. Accordingly, a plurality of recess regions 24R exposing a portion of the active region 13 may be formed between the bit line structures BL. Anisotropic etching or a combination of anisotropic etching and isotropic etching may be used to form recess regions 24R. For example, a portion of the active region 13 and the device isolation layer 12 exposed through the contact opening 24 between the bit line structures BL may be etched. In another embodiment, the hard mask layer 14 may also be isotropically etched. The recess regions 24R may extend into the substrate 11. The contact openings 24 and the recess regions 24R may be interconnected. The vertical structure of the contact openings 24 and the recess regions 24R may be referred to as a 'storage node contact hole'.

Figure 8:
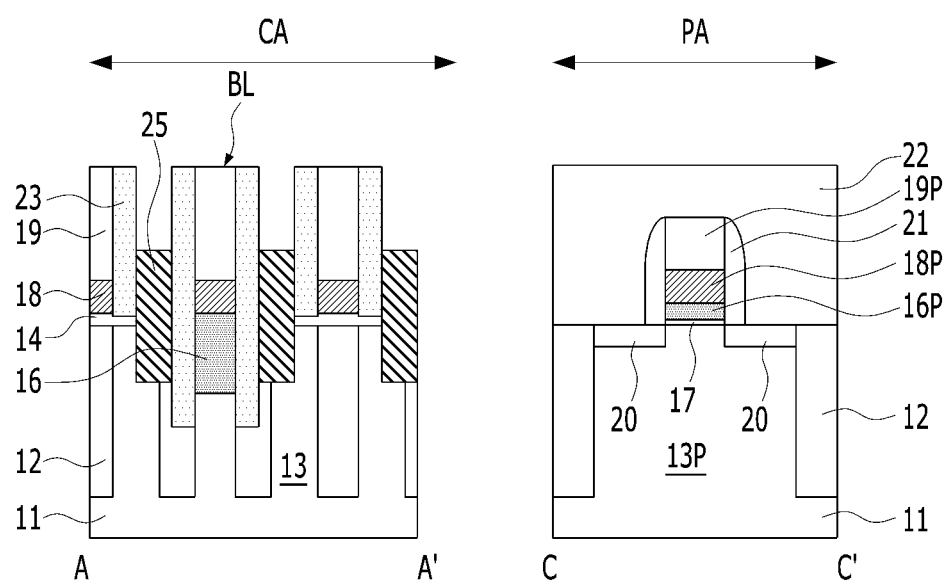

As shown in FIG. 8, a storage contact 25 may be formed. The storage contact 25 may fill the contact openings 24 and the recess regions 24R. The storage contact 25 may be adjacent to the bit line structure BL. From a top view, a plurality of storage contacts 25 may be disposed between a plurality of bit line structures BL. In a direction parallel to the bit line 18, a plurality of storage contacts 25 may be alternately disposed between adjacent bit lines 18.

The storage contact 25 may include, for example, a silicon-containing material. The storage contact 25 may include polysilicon, and the polysilicon may be doped with impurities. The upper surface of the storage contact 25 may be at a higher level than the upper surface of the bit line 18. Polysilicon may be deposited to fill the contact openings 24 and the recess regions 24R and then planarization and etch-back processes may be sequentially performed on the polysilicon to form the storage contact 25. The storage contact 25 may be formed only in the cell region CA.

Figure 9:
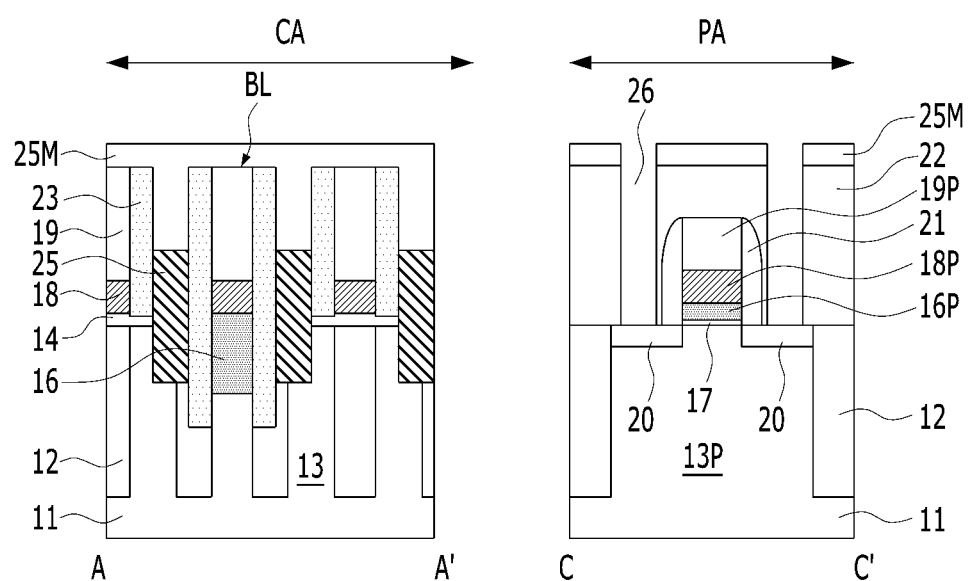

As shown in FIG. 9, a mask layer 25M covering an upper portion of the storage contact 25 may be formed. The mask layer 25M may be a material for forming a contact hole in the peripheral circuit region PA. The interlayer dielectric layer 22 of the peripheral circuit region PA may be etched using the mask layer 25M as an etch barrier. Accordingly, a contact hole 26 exposing the source/drain regions 20 may be formed.

Figure 10:
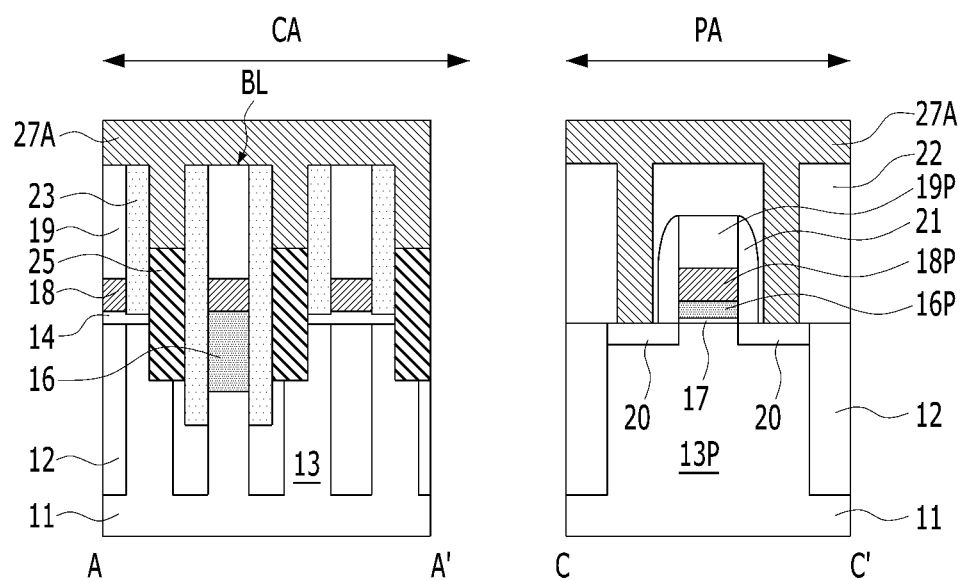

As shown in FIG. 10, after the mask layer 25M is removed, a metal-based material 27A may be formed on the storage contact 25. The metal-based material 27A may fill the contact hole 26 of the peripheral circuit region PA. Although not shown, a metal silicide layer may be formed on the storage contact 25 before the metal-based material 27A is formed. The metal-based material 27A may include a material containing tungsten. The metal-based material 27A may include a tungsten layer or a tungsten compound.

Figure 11:
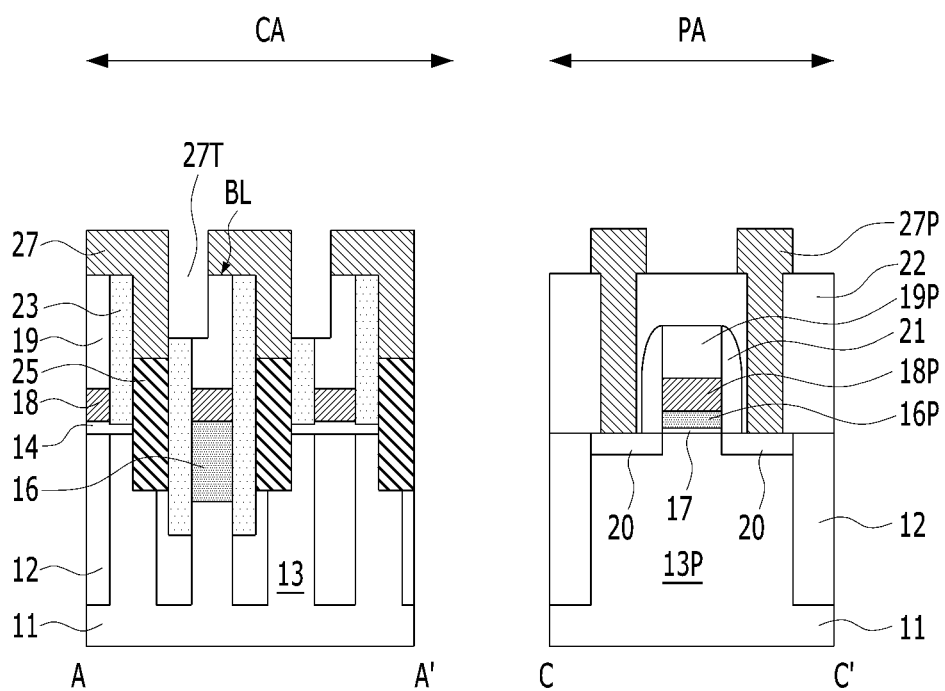

As shown in FIG. 11, a landing pad 27 may be formed by etching the metal-based material 27A. The landing pad 27 may be formed on the storage contact 25. While the landing pad 27 is formed, a metal interconnection 27P may be formed in the peripheral circuit region PA. The upper end of the landing pad 27 may extend to overlap the upper surface of the bit line hard mask 19. A pad isolation trench 27T may be formed between adjacent landing pads 27. The pad isolation trench 27T may be formed between the landing pads 27 and the bit line hard mask 19. The landing pads 27 and the metal interconnection 27P may be disposed at the same level.

Figure 12:
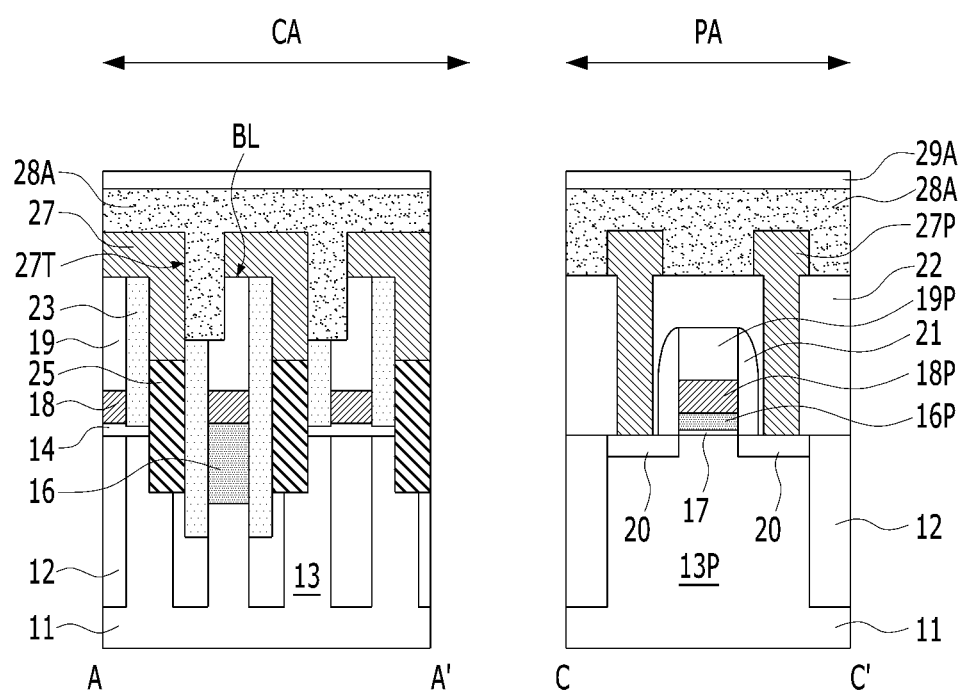

As shown in FIG. 12, a first low-k spacer layer 28A filling the pad isolation trench 27T between the landing pads 27 may be formed. The first low-k spacer layer 28A may also be filled between the metal interconnections 27P in the peripheral circuit region PA. The first low-k spacer layer 28A may include a low-k material containing boron, for example, boron nitride (BN), SiBN, or SiBCN. The first low-k spacer layer 28A may improve hydrogen passivation properties in the cell region CA. The hydrogen passivation properties refer to the removal of dangling bonds on the substrate surface by diffusion of hydrogen.

A second low-k spacer layer 29A may be formed on the first low-k spacer layer 28A. The second low-k spacer layer 29A may include a material that improves Negative Bias Temperature Instability (NBTI) in the peripheral circuit region PA. The NBTI refers to the trapping of positive charges such as hydrogen at the interface between the gate dielectric layer and the substrate during operation of the transistor, thereby deteriorating the transistor characteristics. In order to improve the NBTI, the second low-k spacer layer 29A may include a hydrogen trapping material, for example, a carbon-containing material capable of trapping hydrogen. The second low-k spacer layer 29A may include a carbon-containing low-k material, for example, SiCO, SiCN, SiOCN, or SiBCN. The first low-k spacer layer 28A and the second low-k spacer layer 29A may be made of different materials. The second low-k spacer layer 29A may be made of a material harder than the first low-k spacer layer 28A. For example, the first low-k spacer layer 28A may be made of SiBN, and the second low-k spacer layer 29A may be made of SiCN. SiBN may improve the passivation characteristic in the cell region CA, and SiCN may improve the NBTI in the peripheral circuit region PA. Parasitic capacitance between adjacent landing pads 27 may be reduced by the first low-k spacer layer 28A. In addition, parasitic capacitance between the adjacent metal interconnections 27P may be reduced by the first low-k spacer layer 28A. As a comparative example, silicon nitride may be used as the first low-k spacer layer 28A, but in this case, the parasitic capacitance between the neighboring landing pads 27 and the parasitic capacitance between the neighboring metal interconnections 27P may increase.

Figure 13:
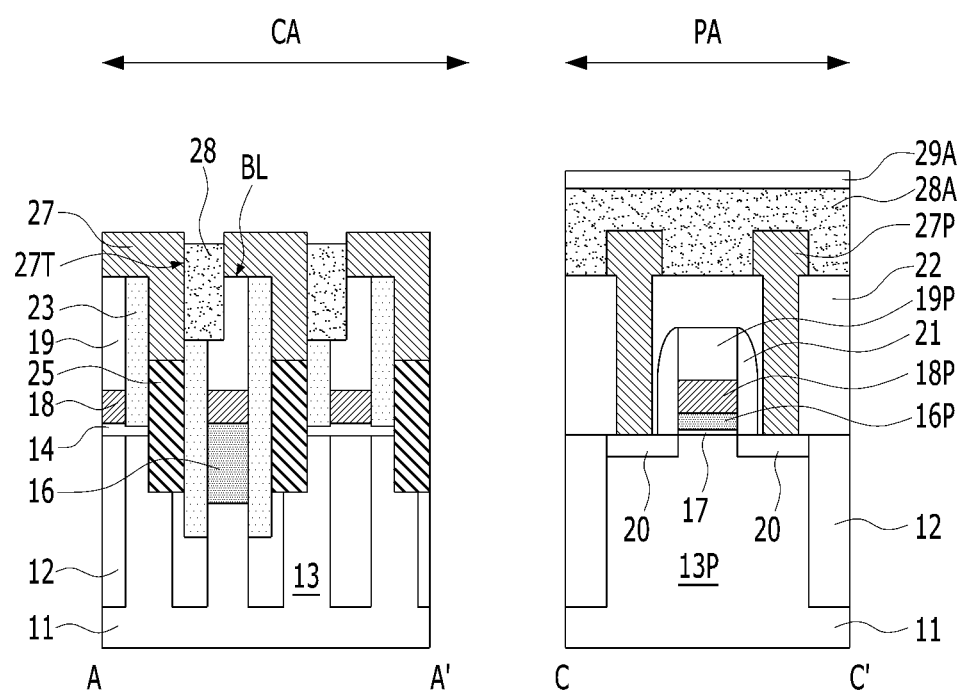

As shown in FIG. 13, the second low-k spacer layer 29A may be selectively removed from the cell region CA. Subsequently, the first low-k spacer layer 28A may be partially etched from the cell region CA. Accordingly, the low-k capping layer 28 may be formed between the landing pads 27. The low-k capping layer 28 may include a low-k material containing boron, for example, boron nitride (BN), SiBN, or SiBCN. The low-k capping layer 28 may fill each of the pad isolation trenches 27T and may cap the upper portion of the bit line spacer 23. The upper surface of the low-k capping layer 28 may be at a level lower than the upper surface of the landing pad 27. When the bit line spacer 23 includes an air gap, the low-k capping layer 28 may cap the air gap.

The first low-k spacer layer 28A and the second low-k spacer layer 29A may remain in the peripheral circuit region PA.

Figure 14:
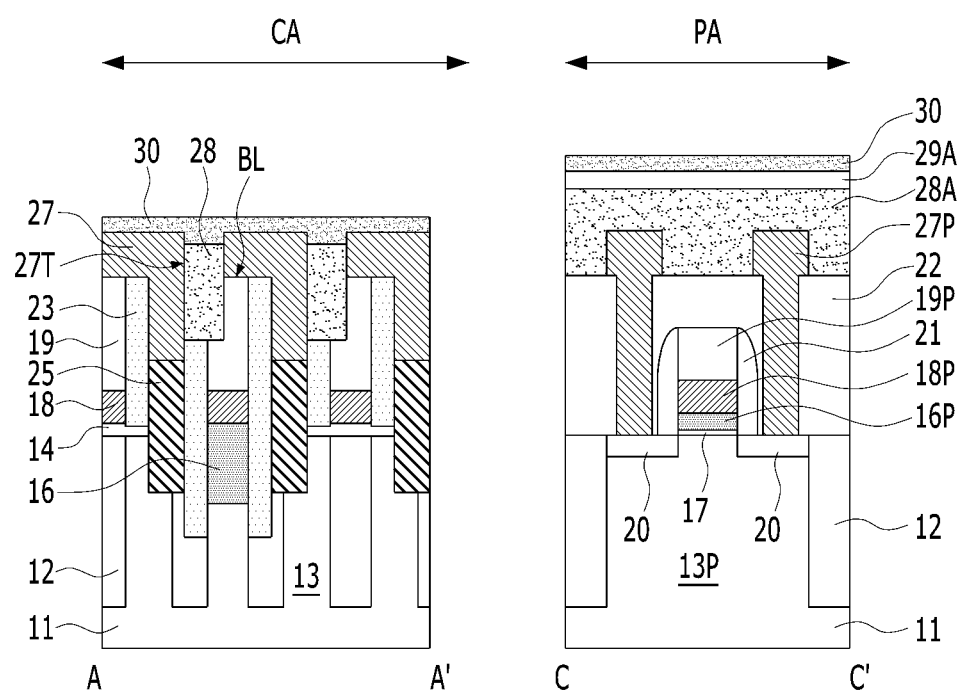

As shown in FIG. 14, an etch stop layer 30 may be formed. The etch stop layer 30 may include silicon nitride or a low-k material. The etch stop layer 30 may be simultaneously formed in the cell region CA and the peripheral circuit region PA. For example, the etch stop layer 30 may include silicon nitride or a boron-containing material. The etch stop layer 30 may include $Si_3N_4$, SiCN, SiOCN, SiBN, or SiBCN.

Subsequently, as referred in FIGS. 2B and 2C, a capacitor 230 including a storage node 220, a dielectric layer 221, and a plate node 222 may be formed. The storage node 220 of the capacitor 230 may pass through the etch stop layer 30 of the cell region CA and may be connected to the landing pad 27. In the etching process for forming the plate node 222, the etching may stop at the second low-k spacer layer 29A, and the etch stop layer 30 may be removed from the peripheral circuit region PA.

The low-k capping layer 28 may remain between the landing pads 27 in the cell region CA, and the first low-k spacer layer 28A may remain between the metal interconnections 27P in the peripheral circuit region PA. The etch stop layer 30 may remain on the low-k capping layer 28 in the cell region CA, and the second low-k spacer layer 29A may remain on the first low-k spacer layer 28A of the peripheral circuit region PA. The low-k capping layer 28 and the first low-k spacer layer 28A may be a carbon-free material, and the second low-k spacer layer 29A may be a carbon-containing material. The low-k capping layer 28 and the first low-k spacer layer 28A may be made of SiBN, the second low-k spacer layer 29A may be made of SiCN, and the etch stop layer 30 may be formed of silicon nitride ($Si_3N_4$).

According to the above-described embodiment, since the first and second low-k spacer layers 28A and 29A are formed, an offset of a transistor formed in the peripheral circuit region PA may be improved, and hydrogen passivation properties may also be secured. As a result, the hydrogen passivation characteristic of the cell region CA may be maintained without deterioration of the NBTI.

As a comparative example, silicon nitride may fill the space between the metal interconnections 27P, and the silicon nitride may improve hydrogen passivation properties. However, when the silicon nitride remains in the peripheral circuit region PA while maintaining the initial thickness, the NBTI may be deteriorated.

In contrast, in the present embodiment, the NBTI characteristic may not be deteriorated because the second low-k spacer layer 29A is formed in the peripheral circuit region PA. For example, since the second low-k spacer layer 29A contains carbon that traps hydrogen, that is, the second low-k spacer layer 29A that traps hydrogen remains in the peripheral circuit region PA, the NBTI may not be deteriorated. Since the second low-k spacer layer 29A does not remain in the cell region CA, the hydrogen passivation properties by the boron-containing low-k capping layer 28 may be maintained.

Figure 15:
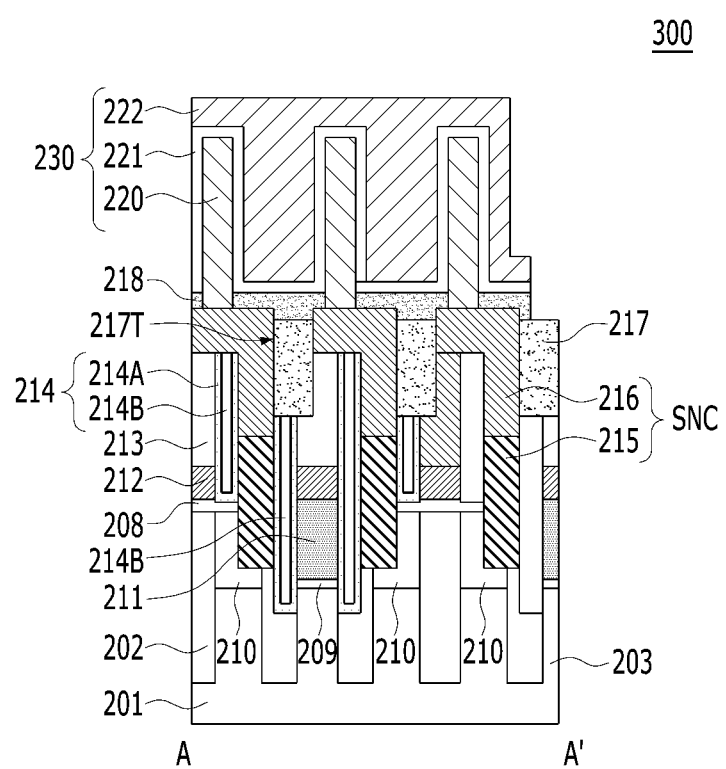
FIGS. 15 and 16 are cross-sectional views illustrating semiconductor devices according to other embodiments of the present invention.
Figure 16:
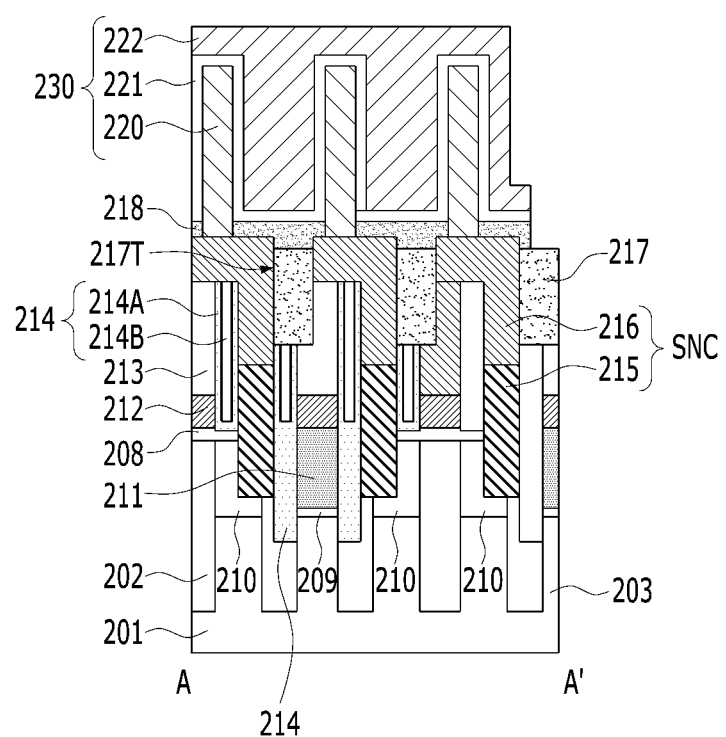

FIGS. 15 and 16 are cross-sectional views illustrating semiconductor devices according to other embodiments.

The semiconductor devices 300 and 301 of FIGS. 15 and 16, respectively, may be similar to the semiconductor device 100 of FIG. 2A. Hereinafter, detailed descriptions of duplicate components may be omitted.

Referring to FIGS. 15 and 16, the semiconductor devices 300 and 301 may include a bit line spacer 214, and the bit line spacer 214 may include a dielectric spacer 214A and an air gap 214B. The dielectric spacer 214A may include, for example, silicon oxide, silicon nitride, a low-k material, or a combination thereof. The air gap 214B may be disposed between at least one or more dielectric spacers 214A. For example, the bit line spacer 214 may include NKAK, NAN, NKAN, NKAKN, or NAK, and K may include a low-k material. The low-k material of the bit line spacer 214 may include SiBN, and a ratio of SiN to BN in the SiBN is 1:1.

The air gap 214B of FIG. 15 may be formed on a sidewall of the bit line 212 and may extend to be disposed on a sidewall of the bit line contact plug 211.

The air gap 214B of FIG. 16 may be formed on a sidewall of the bit line 212 and may not be disposed on a sidewall of the bit line contact plug 211.

In FIGS. 15 and 16, the low-k capping layer 217 may seal the upper portion of the air gap 214B. The low-k capping layer 217 may include SiBN, in which a ratio of silicon nitride (SiN) to boron nitride (BN) is 1:2 or 2:3.

The bit line spacer 214 may include at least a first SiBN, and the low-k capping layer 217 may include a second SiBN, wherein the second SiBN may have a greater boron concentration than the first SiBN.

The present invention described above is not limited to the above-described embodiments and the accompanying drawings, and it will be apparent to those skilled in the art that various substitutions, modifications, and changes may be made thereto without departing from the spirit and scope of the present invention.

What is claimed is:

1. A semiconductor device, comprising:
a plurality of bit line structures over a substrate;
a plurality of storage contacts disposed between the plurality of bit line structures;
a plurality of bit line spacers formed between the plurality of bit line structures and the plurality of storage contacts;
a plurality of landing pads formed over the plurality of storage contacts, respectively;
a boron-containing capping layer disposed between the plurality of landing pads and contacted with the plurality of landing pads; and
a boron-containing etch stop layer disposed over the boron-containing capping layer and contacted with the boron-containing capping layer,
wherein the plurality of capacitors connected to each of the plurality of landing pads by passing through the only boron-containing etch stop layer, each of the plurality of capacitors including a storage node,
wherein the boron-containing capping layer, the boron-containing etch stop layer and the plurality of bit line spacers include a boron nitride-based material, and
wherein each of the plurality of bit line spacers has a boron concentration greater than the boron-containing etch stop layer and less than the boron-containing capping layer.

2. The semiconductor device of claim 1, wherein
the boron-containing capping layer includes a first SiBN, and
the boron-containing etch stop layer includes a second SiBN.

3. The semiconductor device of claim 1, wherein the plurality of bit line spacers include a combination of an air gap and dielectric spacers including the boron nitride-based material.

4. The semiconductor device of claim 1, wherein
the plurality of bit line spacers include a first SiBN,
the boron-containing capping layer includes a second SiBN.

5. A semiconductor device comprising:
a substrate including a cell region and a peripheral circuit region;
a plurality of storage contacts disposed over the substrate of the cell region;
a plurality of landing pads formed over the plurality of storage contacts, respectively;
a plurality of metal interconnections disposed over the substrate of the peripheral circuit region and spaced apart from the plurality of storage contacts;
a boron-containing capping layer disposed between the plurality of landing pads and contacted with the plurality of landing pads;
a boron-containing spacer layer disposed between the plurality of metal interconnections in the peripheral circuit region; and
a carbon-containing spacer layer over the boron-containing spacer layer in the peripheral circuit region,
wherein the carbon-containing spacer layer includes SiCN for trapping hydrogen on the substrate.

6. The semiconductor device of claim 5, wherein the boron-containing capping layer and the boron-containing spacer layer include a same low-k material.

7. The semiconductor device of claim 5, wherein the boron-containing capping layer and the boron-containing spacer layer include SiBN.

8. The semiconductor device of claim 5, further including:
a plurality of bit line structures disposed between the plurality of storage contacts and disposed over the substrate of the cell region;
a plurality of bit line spacers formed between the plurality of bit line structures and the plurality of storage contacts;
a boron-containing etch stop layer over the boron-containing capping layer; and
a plurality of capacitors connected to each of the plurality of landing pads by passing through the boron-containing etch stop layer, each of the plurality of capacitors including a storage node.

9. The semiconductor device of claim 8, wherein
the boron-containing capping layer includes a first SiBN,
the boron-containing etch stop layer includes a second SiBN, and
the first SiBN has a boron concentration greater than the second SiBN.

10. The semiconductor device of claim 8, wherein the plurality of bit line spacers include an air gap and dielectric spacers.

11. The semiconductor device of claim 8, wherein
the plurality of bit line spacers include a first SiBN,
the boron-containing capping layer includes a second SiBN, and
the second SiBN has a boron concentration greater than the first SiBN.

12. The semiconductor device of claim 8, wherein
the plurality of bit line spacers include a first SiBN,
the boron-containing capping layer includes a second SiBN,
the boron-containing etch stop layer includes a third SiBN,
the second SiBN has a boron concentration greater than the third SiBN, and
the first SiBN has a boron concentration greater than the third SiBN.

* * * * *